United States Patent
Kerchaert

(10) Patent No.: US 6,300,563 B1
(45) Date of Patent: Oct. 9, 2001

(54) GAUGE ASSEMBLY HAVING AN ADAPTABLE COIL ASSEMBLY

(75) Inventor: Robert B Kerchaert, Linden, MI (US)

(73) Assignee: DaimlerChrysler Corporation, Auburn Hills, MI (US)

( * ) Notice: Subject to any disclaimer, the term of this patent is extended or adjusted under 35 U.S.C. 154(b) by 0 days.

(21) Appl. No.: 09/666,671

(22) Filed: Sep. 20, 2000

Related U.S. Application Data

(60) Continuation-in-part of application No. 09/522,443, filed on Mar. 9, 2000, which is a division of application No. 09/189,262, filed on Nov. 10, 1998, now Pat. No. 6,055,857.

(51) Int. Cl.$^7$ ........................................................ H01J 5/00
(52) U.S. Cl. .............................. 174/50; 174/48; 220/4.02; 361/600
(58) Field of Search ............................... 174/48, 50, 17 R, 174/53, 58, 60; 220/3.92, 3.94, 4.02, 3.6; 73/431; 361/600, 807, 808; 248/27.1, 27.3, 906

(56) References Cited

U.S. PATENT DOCUMENTS

| | | |
|---|---|---|
| 1,750,601 | 3/1930 | Keeney . |
| 2,616,642 | 11/1952 | Bush et al. . |
| 2,745,275 | 5/1956 | Jacobi . |
| 2,798,271 | 7/1957 | Flora . |
| 3,122,679 | 2/1964 | Kislan et al. . |
| 3,214,508 | 10/1965 | Hennessey . |
| 3,322,380 | 5/1967 | Affel et al. . |
| 3,601,699 | 8/1971 | Norton, Jr. et al. . |
| 3,689,013 | 9/1972 | Neugebauer . |
| 3,793,563 | 2/1974 | Brefka . |
| 4,080,570 | 3/1978 | Pearson . |
| 4,310,133 | 1/1982 | Wetterhorn et al. . |
| 4,367,513 | 1/1983 | Cronin . |
| 4,404,522 | 9/1983 | Pucciarello . |
| 4,410,155 | 10/1983 | Wetterhorn et al. . |
| 4,886,227 | 12/1989 | Matl . |
| 4,929,182 | 5/1990 | Hyogo et al. . |
| 5,062,604 | 11/1991 | Monnier . |
| 5,178,548 | 1/1993 | Fortmann et al. . |
| 5,205,749 | 4/1993 | Weingartner . |
| 5,219,135 | 6/1993 | Scott . |
| 5,225,970 | 7/1993 | Palumbo . |
| 5,323,297 | 6/1994 | Palumbo et al. . |

(List continued on next page.)

Primary Examiner—Dean A. Reichard
Assistant Examiner—Dhiru R Patel
(74) Attorney, Agent, or Firm—Mark P. Calcaterra

(57) ABSTRACT

A gauge assembly is provided including a terminal carrier including a base portion, a head portion extending from a first side of the base portion, and a plurality of legs extending from a second side of the base portion. The head portion includes a twist lock locking element disposed on a side thereof. A bobbin and coil assembly is supported by the terminal carrier. The bobbin and coil assembly further provides a coil wire component which can be coupled to the gauge assembly by snapping the coil wire component into place. The terminal ends of the coil wire component are connected to terminal pads. Therefore the coil wire components are connected to terminal pads. Therefore the coil wire component can be easily integrated by receiving the terminal pads and quickly establishing electrical contact. The bobbin and coil assembly rotatably supports a spindle and magnet. A plurality of electrical terminals extend through the base portion of the terminal carrier and terminate at one end into a bent contact portion adjacent to the head portion which engage electrical contact pads disposed on the printed circuit board. The electrical terminals have a second end electrically connected to a coil of the bobbin and coil assembly. A plurality of mounting bosses are mounted to the display panel and are provided with sloped surfaces for guiding the gauge assembly to a centered position when the display panel and printed circuit board are mounted together. One of the mounting bosses is attached to the printed circuit board.

6 Claims, 6 Drawing Sheets

U.S. PATENT DOCUMENTS

| | | | |
|---|---|---|---|
| 5,337,220 | * | 8/1994 | Granitz .................................. 361/816 |
| 5,345,366 | | 9/1994 | Cheng et al. . |
| 5,426,265 | | 6/1995 | Savage, Jr. . |
| 5,430,612 | | 7/1995 | Simon et al. . |
| 5,528,934 | * | 6/1996 | Nelson et al. .......................... 73/431 |
| 5,624,167 | | 4/1997 | Katz . |
| 5,631,419 | | 5/1997 | Fruitman et al. . |
| 5,672,823 | | 9/1997 | Lachmann et al. . |
| 6,094,983 | * | 8/2000 | Pearl ...................................... 73/431 |
| 6,169,248 | * | 1/2001 | Rowe et al. ............................ 174/50 |

* cited by examiner

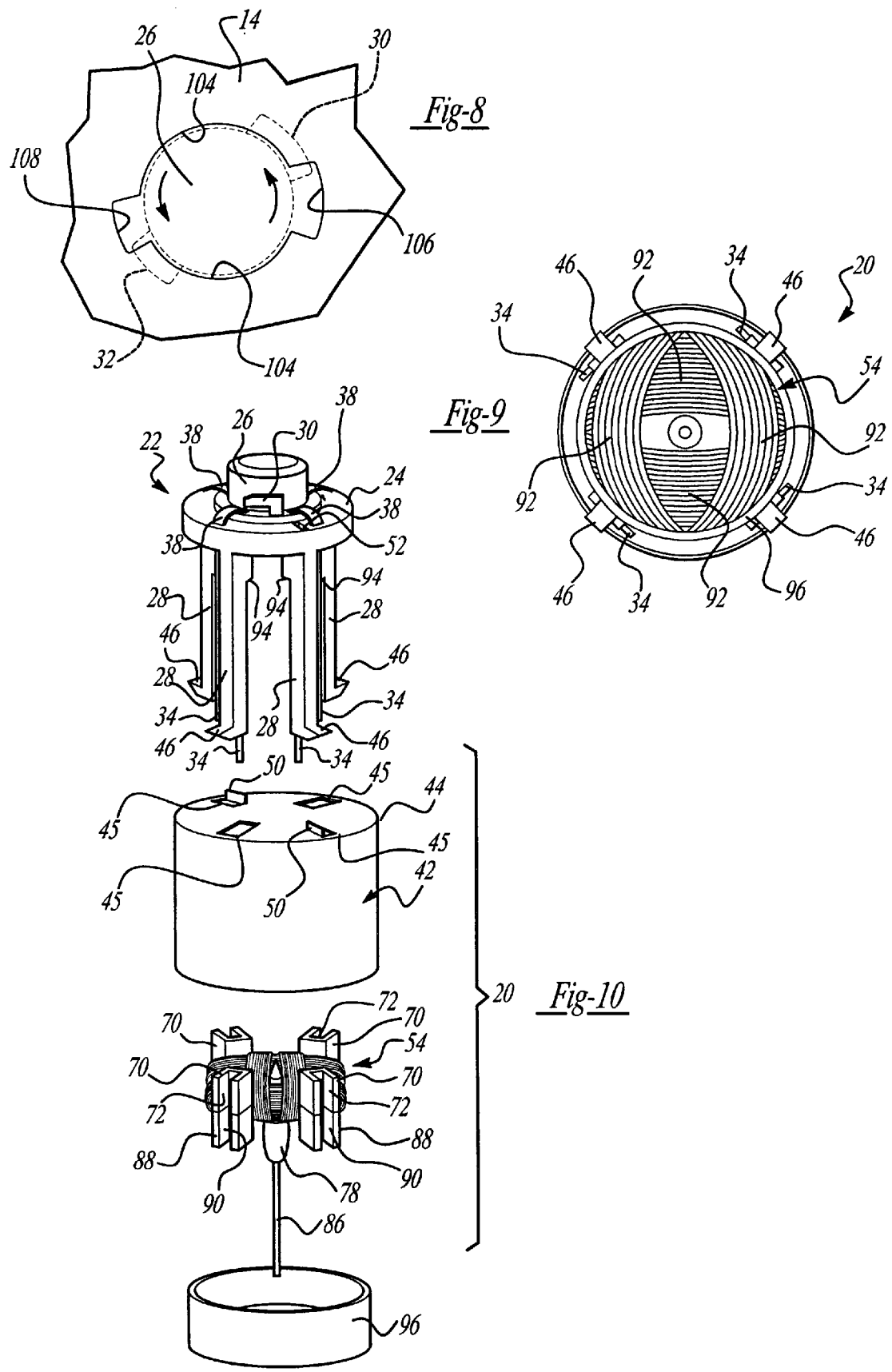

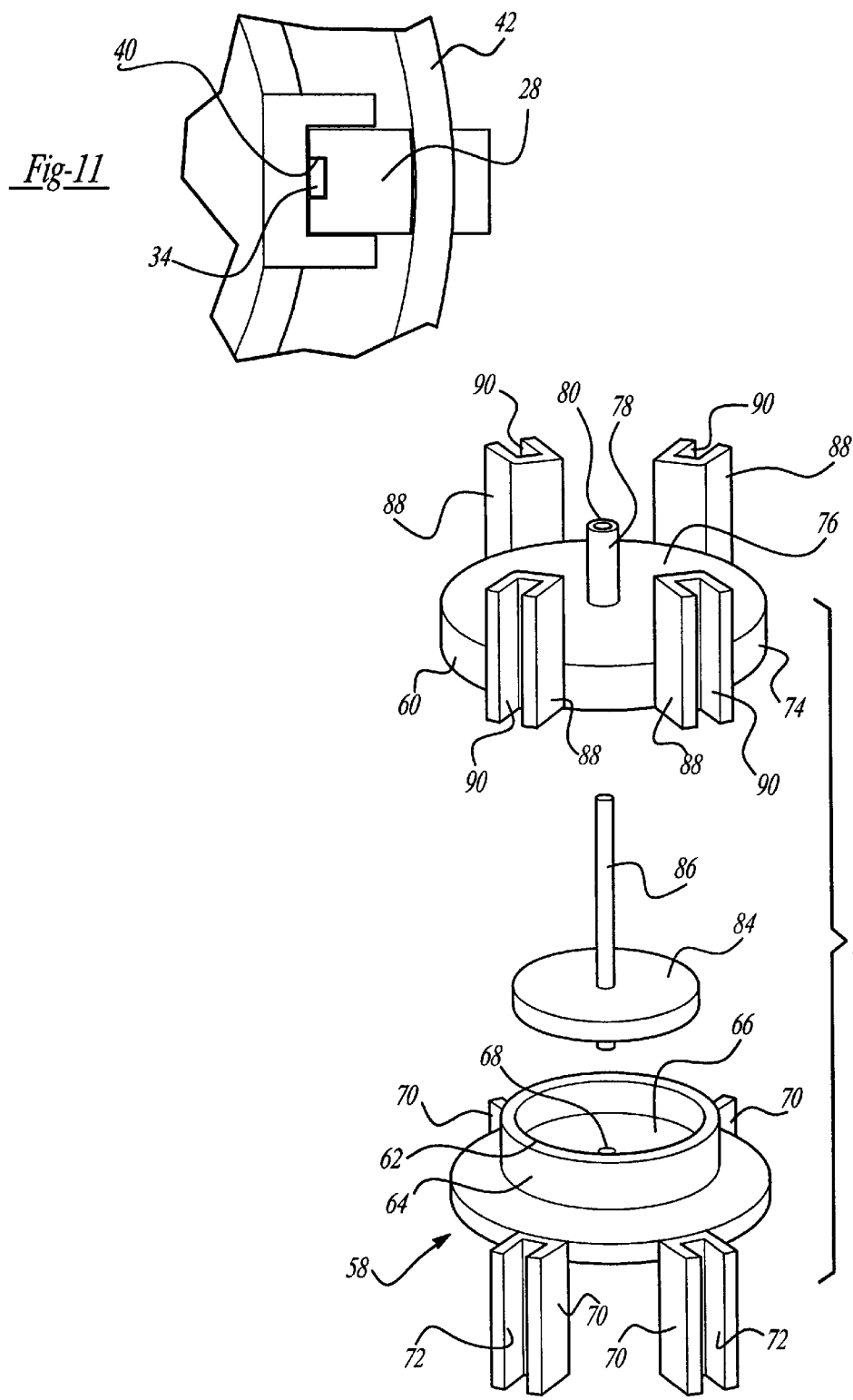

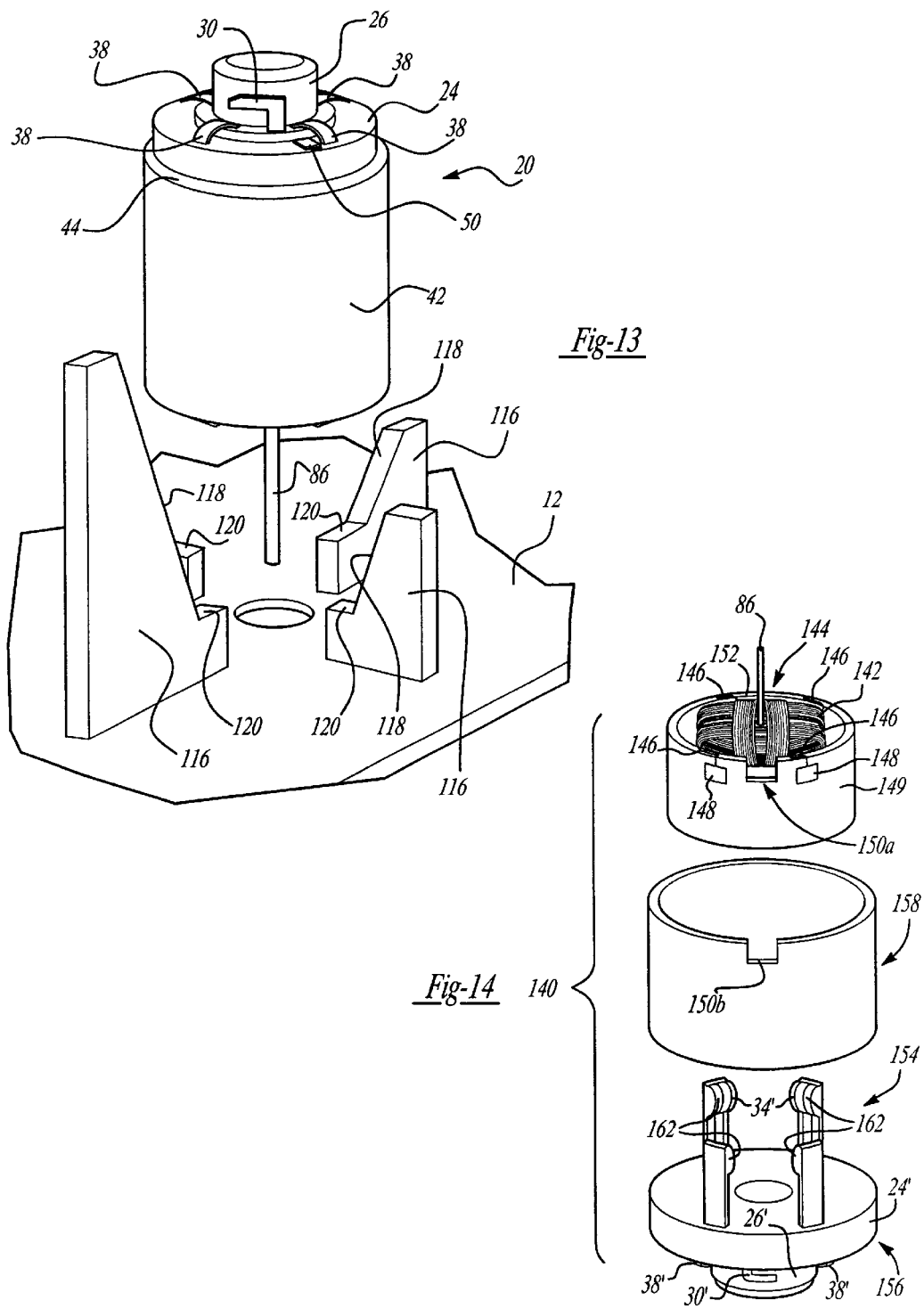

GAUGE ASSEMBLY HAVING AN ADAPTABLE COIL ASSEMBLY

This is a continuation-in-part of U.S. application Ser. No. 09/522,443 filed Mar. 9, 2000 which is a divisional of U.S. application Ser. No. 09/189,262 filed Nov. 10, 1998, now U.S. Pat. No. 6,055,857 issued May 2, 2000.

BACKGROUND OF THE INVENTION

1. Field of the Invention

The present invention relates generally to a gauge assembly for use in a vehicle instrument cluster, and more particularly, to a gauge assembly with a twist lock mounting feature having an adaptable coil component.

2. Background and Summary of the Invention

Instrument cluster gauges, such as speedometers, tachometers, fuel and temperature gauges used in modem vehicles commonly include a pointer body or needle coupled to a permanent magnet. The magnet is generally carried in a plastic housing or bobbin, which is wrapped with wire coils. During operation of the vehicle, current flowing through the coils creates a magnetic field, and the magnet rotates within the housing to align itself in force balance relationship with the magnetic field. Since the pointer body rotates with the magnet, positioning of the pointer body is controlled by the direction and magnitude of the current in the coils. To provide for steady movement of the pointer body, a viscous fluid is carried in the housing to damp the rotational movement of the magnet.

Current gauge assembly designs include a plurality of post-like terminals which are inserted in gauge mounting clips which are provided on the circuit boards. The gauge assembly is typically mounted to the display panel using mounting screws. Typical gauges are disclosed in U.S. Pat. Nos. 5,219,135 and 5,631,419. A disadvantage of these types of gauges is that they require mounting screws to mount the gauges to the display panel, and thus require a considerable amount of labor for mounting the gauge to the instrument cluster assembly. In addition, the electrical contact through the terminal posts and the gauge clips can create problems due to intermittent contact.

Accordingly, it is an object of the present invention to provide an alternative mounting technique for mounting a gauge to an instrument cluster assembly. These and other objects of the present invention are obtained by providing a gauge assembly including a terminal carrier including a base portion, a head portion extending from a first side of the base portion, and a plurality of legs extending from a second side of the base portion. The head portion includes a pair of twist lock locking elements disposed on the side thereof. A bobbin and coil assembly is supported by the terminal carrier. The bobbin and coil assembly rotatably supports a spindle and magnet. A plurality of electrical terminals extend through the base portion of the terminal carrier and terminate at one end into a bent contact portion adjacent to the head portion. The bent contact portions engage electrical contact pads disposed on the printed circuit board. The electrical terminals have a second end electrically connected to a coil of the bobbin and coil assembly. A plurality of mounting bosses are provided on the back of the display panel to receive and guide the gauge assembly to its proper location.

Furthermore, it is an object of the present invention to provide an alternate method of incorporating the wire coil component of the coil and bobbin assembly within the metal housing of the gauge assembly. Currently, the attachment of the wire component to the electric terminals of the gauge assembly requires soldering of the electric terminal ends to the ends of the wire component. This increases the amount of time and labor required to complete the construction of the gauge assembly. Redesigning the coil wire component of the coil and bobbin assembly such that the assembly may be adapted to the metal housing without the need to solder or weld the ends of the wires, reduces the amount of time and effort necessary to incorporate the coil and bobbin assembly within the metal housing of the gauge assembly.

The gauge assembly of the present invention eliminates the need for gauge mounting clips on the circuit board, reduces problems due to intermittent contact through the gauge clips and provides a higher level of reliability with the twist/wipe contacts used in the present invention. Furthermore, the gauge assembly of the present invention eliminates mounting screws and the associated assembly labor. The gauge assembly design of the present invention also reduces the package height of the gauge assembly which in turn reduces the overall thickness of the instrument cluster.

Further areas of applicability of the present invention will become apparent from the detailed description provided hereinafter. It should be understood however that the detailed description and specific examples, while indicating preferred embodiments of the invention, are intended for purposes of illustration only, since various changes and modifications within the spirit and scope of the invention will become apparent to those skilled in the art from this detailed description.

BRIEF DESCRIPTION OF THE DRAWINGS

The present invention will become more fully understood from the detailed description and the accompanying drawings, wherein:

FIG. 8 illustrates the engagement of the twist-lock locking elements of the gauge assembly according to the principles of the present invention;

FIG. 9 is a bottom view of the gauge assembly according to the principles of the present invention;

FIG. 10 is an exploded perspective view of the gauge assembly according to the principles of the present invention;

FIG. 11 is a cross-sectional view taken along line 11—11 of FIG. 2;

FIG. 12 is an exploded perspective view of the bobbin assembly according to the principles of the present invention;

FIG. 13 is a perspective view illustrating the mounting bosses for guiding the gauge assembly of the present invention;

FIG. 14 is an exploded perspective view of an alternate embodiment of the present invention having an adaptable coil component.

DETAILED DESCRIPTION OF THE PREFERRED EMBODIMENTS

Figure 1:
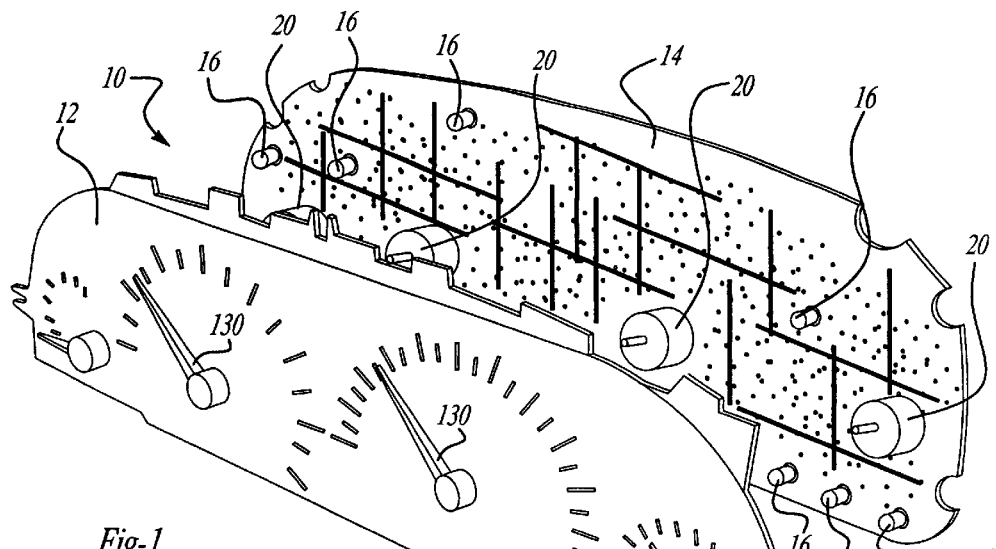
FIG. 1 is a perspective view of an instrument cluster assembly according to the principles of the present invention.

With reference to the accompanying figures, the twist-lock gauge assembly of the present invention will now be described. FIG. 1 illustrates an instrument cluster 10 including a display panel 12 and printed circuit board 14. The printed circuit board 14 includes a plurality of circuit elements which are standard for many instrument cluster printed circuit boards. A plurality of light bulbs 16 are mounted to the printed circuit board for providing light to the display panel 12 using known illumination techniques. A plurality of gauge assemblies 20 according to the principles of the present invention are mounted to the printed circuit board 14 in a manner that will be described herein.

Figure 4:
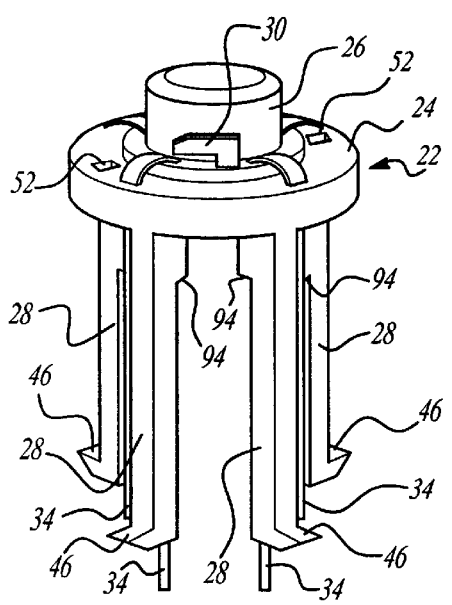
FIG. 4 is a perspective view of the terminal carrier of the gauge assembly according to the principles of the present invention.
Figure 5:
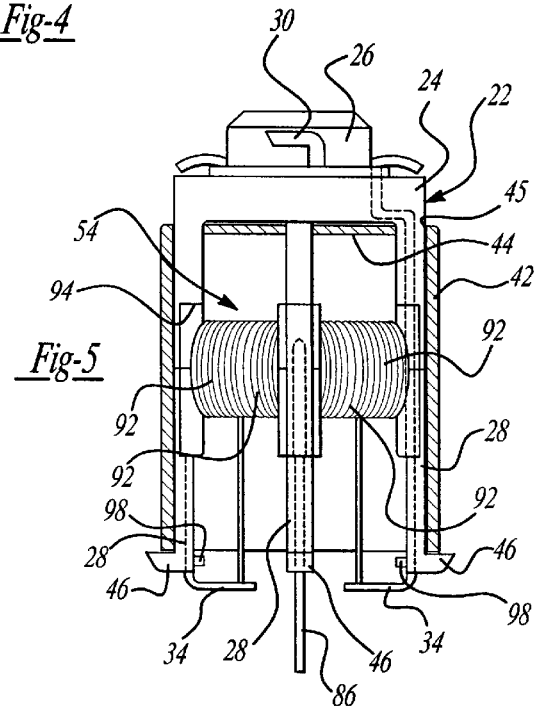
FIG. 5 is a side view of the gauge assembly of the present invention with the housing cut away and illustrating the long locking element disposed on one side of the terminal carrier.
Figure 6:
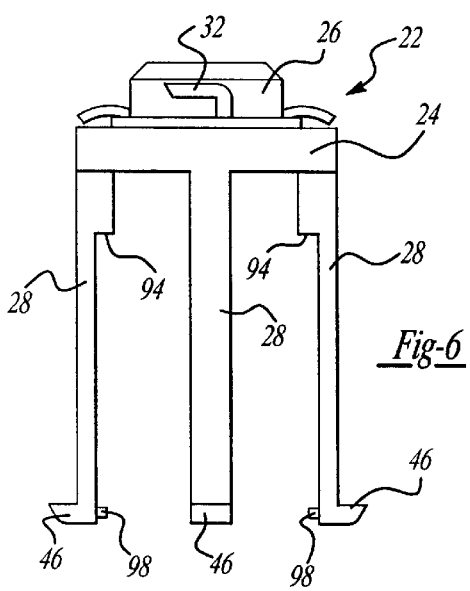
FIG. 6 is a side view of the terminal carrier illustrating the short locking element disposed on an opposite side of the terminal carrier.
Figure 7:
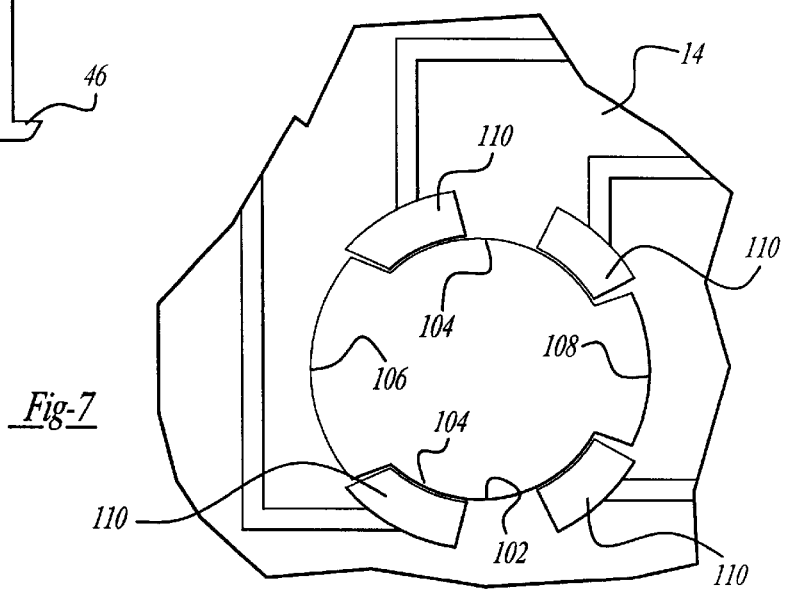
FIG. 7 is a partial view of a printed circuit board having a keyed opening for receiving the twist-lock gauge assembly of the present invention, and illustrating the electrical contact pads for engaging the electrical terminals of the gauge assembly.

The gauge assembly 20 will now be described with reference to FIGS. 2–14. The gauge assembly 20 includes a terminal carrier 22 best shown in FIGS. 4–6. The terminal carrier 22 includes a base portion 24, a head portion 26 extending from one side of the base portion 24 and a plurality of legs 28 extending from an opposite side of the base portion 24. The head portion 26 includes a pair of twist-lock locking elements 30, 32. One locking element 30 is a long locking element while the second locking element 32 is a short locking element. A plurality of electrical terminals 34 extend through openings 36 provided in the base portion 24 of the terminal carrier 22. The electrical terminals 34 terminate at a first end into a bent contact portion (or twist/wipe contacts) 38 adjacent to the head portion 26 of the terminal carrier 22. Terminals 34 each extend along a leg 28 of the terminal carrier. Legs 28 are provided with recessed grooves 40 for receiving the terminals 34 therein, as best shown in FIG. 11. The gauge assembly 20 also includes a generally cup-shaped housing 42 which is provided with a base portion 44 having a plurality of holes 45 for receiving the legs 28 of terminal carrier 22. The legs 28 are provided with outwardly extending feet portions 46 which engage the distal end of the sidewall portion of the housing 42. In addition, housing 42 is provided with clinch tabs 50 (shown in FIG. 10) which are received in a slot 52 in the base portion 24 of terminal carrier 22. Clinch tabs 50, after being inserted in slots 52, are bent over in order to secure the housing 42 to the terminal carrier 22.

Figure 2:
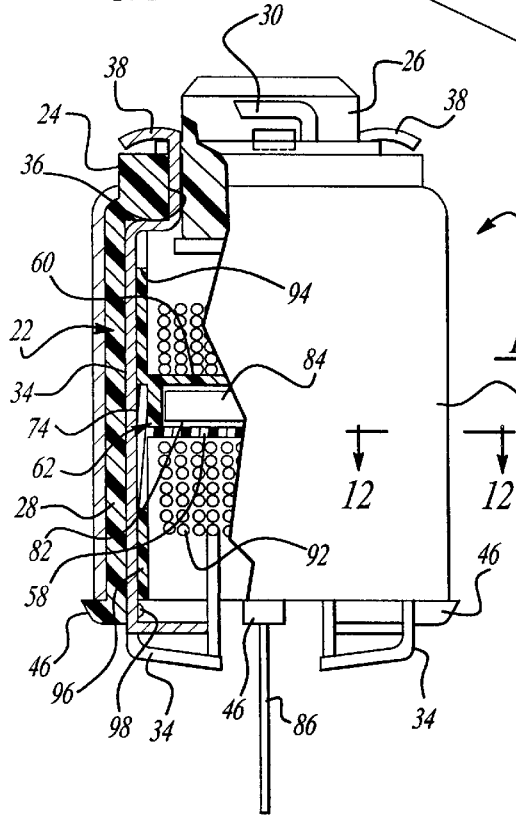
FIG. 2 is a partial cross-sectional view of a gauge assembly according to the principles of the present invention.
Figure 3:
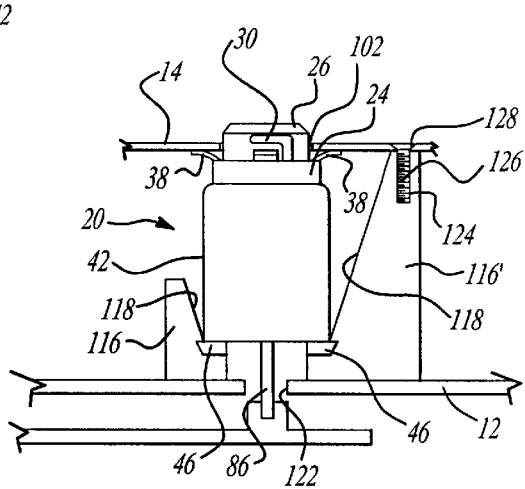
FIG. 3 is a side view of the gauge assembly of the present invention having positioning bosses mounted to the display panel for guiding the gauge assembly to its final position.

A coil and bobbin assembly 54 is supported by the legs 28 of the terminal carrier 22. The coil and bobbin assembly 54 includes a two-piece bobbin assembly 56 best shown in FIG. 12. The bobbin assembly 56 includes a first housing element 58 and a second housing element 60. The first housing element defines an annular wall portion 62 having an outer mating surface 64. A generally planar end wall portion 66 is provided with an opening 68. A plurality of axially extending arm portions 70 are provided with axially extending channels 72 which are adapted to receive the legs 28 of the terminal carrier 22. Similarly, the second housing element 60 is provided with an annular wall portion 74 which has an interior engagement surface. A generally planar end wall 76 is provided with an axially extending nose portion 78 with an opening 80 extending therethrough. The annular wall portion 62 of first housing element 58 is received within the annular wall portion 74 of second housing element 60 in order to define a generally cylindrical sealed chamber 82, as best shown in FIG. 2. A disk-shaped magnet 84 is supported within the chamber 82 by a spindle 86 which has a first end which extends into opening 68 of first housing element 58, and a second end which extends through bore 80 and the nose portion 78 of second housing element 60. The second housing element 60 is also provided with a plurality of arms 88 which are provided with axially extending channels 90 which receive the legs 28 of terminal carrier 22, as best shown in FIG. 11. The bobbin assembly 56 is provided with four wrapped coils 92 as shown in FIG. 9, and as is known in the art.

The bobbin and coil assembly 54 is slidably received on the legs 28 of terminal carrier 22. The upper end of the arms 70 abut against a shoulder portion 94 of the legs 28. A retaining ring 96 is inserted below the bobbin and coil assembly 54 and engages the end of the legs 88 of second bobbin housing element and retains the bobbin and coil assembly 54 in place. The retaining ring 96 is held in place by a plurality of internal projections 98 provided on the interior surface of legs 28. The electric terminals 34 are bent inward at a second end thereof as shown in FIG. 2 and individually connected to one of the coils 92 by solder or welding.

Figure 15:
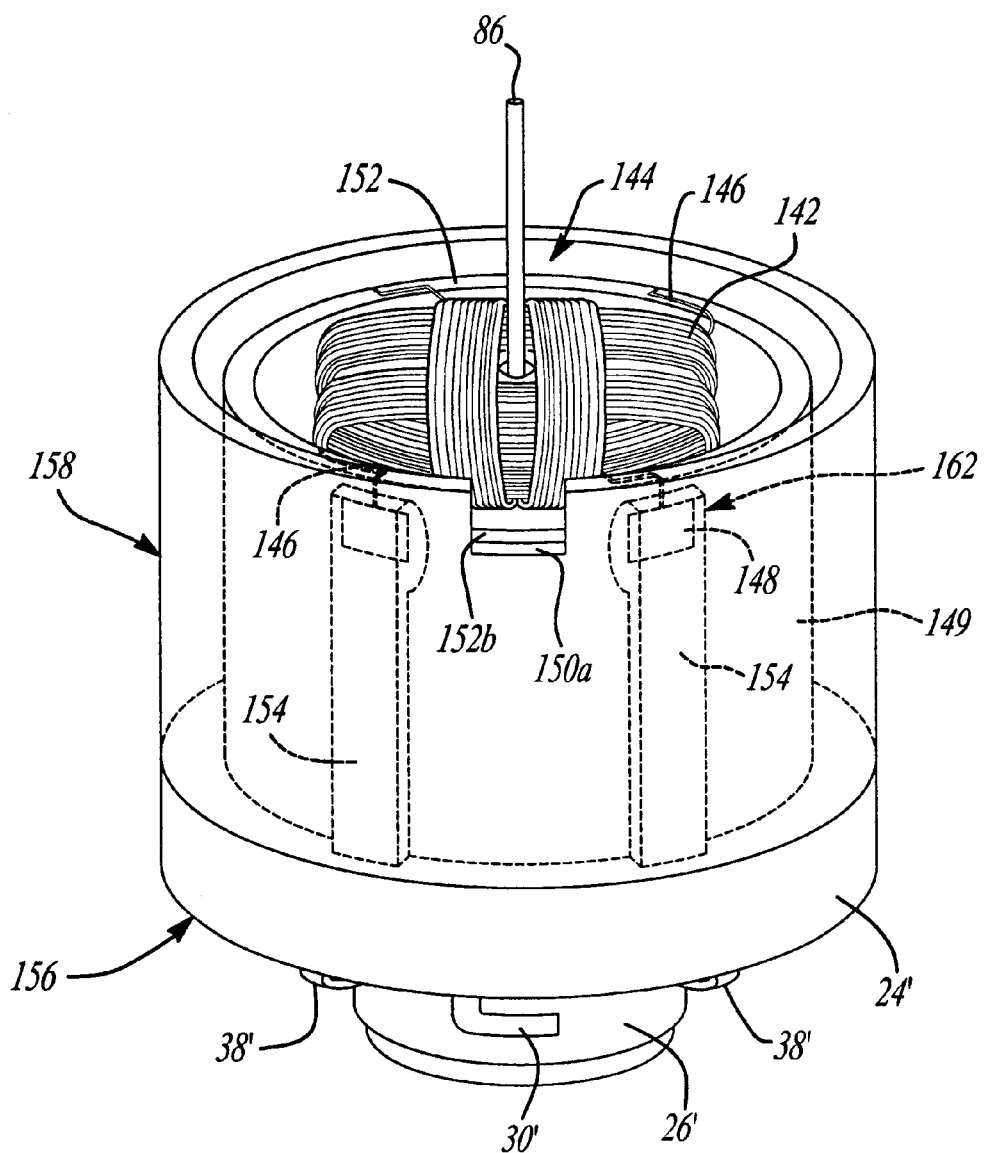
FIG. 15 is a perspective view of the gauge assembly of FIG. 14 shown in the assembled condition.

As can be seen in FIGS. 14 and 15, an alternate embodiment of the gauge assembly 140 is shown. The alternate embodiment provides a snap-fit engagement method of incorporating a coil wire component 142 of the coil and bobbin assembly 144 within the gauge assembly 140. The coil wire component 142 of the bobbin and coil assembly 144 includes a pair of transversely wrapped coils. The terminal ends 146 of the coils of the coil wire component 142 are soldered, welded, or otherwise attached to terminal pads 148 disposed on the exterior of a cylindrical interior housing 149. The terminal pads 148 are comprised of a conductive material which carry electrical currents.

The coil wire component 142 is engaged with the bobbin component 152 to form the bobbin and coil assembly 144. The bobbin and coil assembly 144 includes a spindle 86. The bobbin and coil assembly 144 is disposed within interior housing 149. Interior housing 149 is slidably received against the legs 154 of the terminal carrier 156 within the metal housing 158 of the gauge assembly 144. The terminal carrier 156 includes a base portion 24' and a head portion 26' extending from one side of the base portion 24' and legs 154 extending from the other side of the base portion 24'. The head portion 26' includes a pair of twist-lock locking elements 30' (only one shown) as described above.

The interior housing 149 is further provided with an interlocking key projection 150a. Alignment of the bobbin and coil assembly 144 with the metal housing 158 is determined by the placement of the key projection 150a within a complimentary key slot 150b located on the metal housing 158 of the gauge assembly 140. The alignment of the interlocking key components 150a, 150b ensures that the terminal pads 148 connected to the terminal ends 146 of the coil wire component 142 are slidably contacted by the contact wipers 162 disposed on the legs 154 of the terminal carrier 156. The terminal pads 148 of the coil wire component 142 individually connect with contact wipers 162 located on the legs 154 of terminal carrier 156, as best seen in FIG. 15. The contact wipers 162 are connected to the bent contact portion 38' of electrical terminals 34' of the gauge assembly which need to be interconnected to the coil component of the bobbin and coil assembly. The alternate embodiment of a coil wire component 142 which has terminal pads 148 disposed on an interior housing 149 eliminates the need to solder or weld the terminal ends 146 of the coil to the electric terminals 34'. Therefore, the integration of this particular embodiment may be easily automated during the production of the gauge assembly 140.

Following the insertion of the coil and bobbin assembly, the gauge assembly 20 (hereinafter reference to gauge assembly 20 equally applies to gauge assembly 140) of the present invention is mounted to a printed circuit board 14. The printed circuit board is provided with an opening 102 defining a pair of arcuate shaped edges 104 circularly symmetric about a center, and pair of aperture wing boundary portions 106, 108. The wing boundary portion 106 has a larger dimension than the wing boundary portion 108. A plurality of electric conducting pads 110 are provided around the periphery of the opening 102 at spaced positions. During assembly, the head portion 26 of the gauge assembly 20 is inserted through opening 102 so that the short locking element 32 extends through shorter wing boundary portion 108 and the long locking element 30 extends through longer wing boundary portion 106. The gauge assembly 20 is then rotated as illustrated in FIG. 8 so that locking elements 30 and 32 lockingly engage the printed circuit board 14. Furthermore, during the locking engagement, the bent contact portions 38 of terminals 34 each engage an electrical contact pad 110 for providing electrical communication to the terminals 34. After each of the gauge assemblies 20 are mounted to the printed circuit board 14 as well as any other accessories, the printed circuit board 14 and display panel 12 are assembled to one another.

The display panel 12 is provided with a plurality of mounting bosses 116 which are provided with a sloped guide surface 118 which engage the housing 40 of the gauge assemblies 20 and guide them to the generally flat platform portion 120 of the mounting bosses 116, thereby properly guiding the spindle 86 through the opening 122 in the display panel 12. One of the mounting bosses 116' has a height which is designed to properly space the display panel 12 from the printed circuit board 14. The mounting boss 116' is provided with a threaded opening 124 at an upper end thereof for threadedly receiving a screw 126 which is inserted through an opening 128 in the printed circuit board 14. Thus, the screw 126 secures the printed circuit board 14 to the display panel 12 at a proper spaced location. A pointer 130 is then assembled on the spindle 86 in order to complete the assembly of the instrument cluster 10.

The long locking element 30 and short locking element 32 are provided so that the gauge assembly 20 can only be assembled in one orientation so that the proper electric contact pads 110 engage the proper terminals 34 for controlling the gauge assembly 20. Current flowing through the coils 92 creates a magnetic field, and the magnet 84 rotates within the bobbin assembly 56 to align itself in forced balanced relationship with the field. Since the spindle 86 rotates with the magnet 84, positioning of the pointer body 113 is controlled by the magnitude of the current in the coils 92. To provide for steady movement of the pointer body 130, a viscous fluid is carried in the magnet chamber 82 to damp the rotational movement of the magnet 84. With the gauge assembly 20 of the present invention, the twist lock mounting eliminates the necessity of the screws and the accompanying labor which are required with previous designs. Furthermore, the elimination of the terminal posts which are also used in previous designs, allows the reduction and overall thickness of the instrument cluster and allows the elimination of the gauge mounting clips on the circuit board. Furthermore, the twist-wipe contacts 38 used in the design of the present invention have higher reliability than the intermittent contact problems which occur with the gauge clips.

The invention being thus described, it will be obvious that the same may be varied in many ways. Such variations are not to be regarded as a departure from the spirit and scope of the invention, and all such modifications as would be obvious to one skilled in the art are intended to be included within the scope of the following claims.

What is claimed is:

1. A gauge assembly, comprising:
   a terminal carrier including a base portion, a head portion extending from a first side of said base portion, and a plurality of legs extending from a second side of said base portion, said head portion including a twist lock locking element disposed on a side thereof;
   a plurality of electrical terminals supported by said terminal carrier, said plurality of electrical terminals each including a first contact portion disposed adjacent to said head portion and a second contact portion disposed at an end portion of said plurality of legs;
   a bobbin and coil assembly including a coil wire component having a plurality of terminal ends;
   an interior housing member having a plurality of contact pads mounted to an outer surface of said interior housing, said plurality of terminal ends of said coil wire component being connected to said plurality of contact pads, said second contact portion of said plurality of electrical terminals contact said contact pads.

2. The gauge assembly according to claim 1 wherein said plurality of legs further includes recessed grooves which are complimentary in shape to said electrical terminals.

3. The gauge assembly according to claim 2 wherein said electrical terminals are receivably integrated within said recessed grooves of said legs.

4. The gauge assembly according to claim 1 where said gauge assembly further includes an outer housing, said outer housing receives said bobbin and coil assembly and said terminal carrier.

5. The gauge assembly according to claim 4 wherein said outer housing has an interlocking key slot.

6. The gauge assembly according to claim 5 wherein said interior housing has an interlocking key projection for engaging said interlocking key slot of said outer housing.

* * * * *